US009767752B2

(12) United States Patent
Kim et al.

(10) Patent No.: US 9,767,752 B2
(45) Date of Patent: Sep. 19, 2017

(54) GATE DRIVING CIRCUIT AND DISPLAY DEVICE INCLUDING THE SAME

(71) Applicant: Samsung Display Co., Ltd., Yongin-si, Gyeonggi-do (KR)

(72) Inventors: Kangnam Kim, Asan-si (KR); Duc-han Cho, Seoul (KR); Youmee Hyun, Bucheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/098,078

(22) Filed: Apr. 13, 2016

(65) Prior Publication Data

US 2016/0322015 A1 Nov. 3, 2016

(30) Foreign Application Priority Data

Apr. 30, 2015 (KR) ........................ 10-2015-0062091

(51) Int. Cl.
*G09G 3/36* (2006.01)
*G11C 19/28* (2006.01)
*G11C 19/18* (2006.01)

(52) U.S. Cl.
CPC ......... *G09G 3/3677* (2013.01); *G11C 19/184* (2013.01); *G11C 19/28* (2013.01); *G09G 2310/0286* (2013.01)

(58) Field of Classification Search
CPC . G11C 19/00; G09G 3/30; G09G 3/36; G09G 5/00; G09G 3/34; G09G 3/32; G06F 3/038
See application file for complete search history.

(56) References Cited

U.S. PATENT DOCUMENTS

| 8,456,409 | B2* | 6/2013 | Ko | ........................ | G09G 3/3677 345/100 |
| 8,643,584 | B2* | 2/2014 | Han | ........................ | G09G 3/3677 345/100 |
| 8,941,576 | B2* | 1/2015 | Kang | ........................ | G09G 3/20 345/100 |
| 2006/0022201 | A1* | 2/2006 | Kim | ........................ | G02F 1/1339 257/72 |

(Continued)

FOREIGN PATENT DOCUMENTS

| KR | 10-2011-0031748 A | 3/2011 |
| KR | 10-2013-0109395 A | 10/2013 |
| KR | 10-2014-0064319 A | 5/2014 |

(Continued)

*Primary Examiner* — Pegeman Karimi
(74) *Attorney, Agent, or Firm* — Lewis Roca Rothgerber Christie LLP (57) ABSTRACT

An n-th driving stage of a gate driving circuit includes a first control transistor being configured to increase a voltage of a first node to a first voltage, a control capacitor having one end connected to the first node, a second control transistor being configured to increase the first voltage of the first node to a second voltage that is higher than the first voltage, a third control transistor being configured to increase a voltage of a second node to a third voltage when being turned on according to the voltage applied to the first node, and an output transistor being configured to output a gate signal of the n-th driving stage when being turned on according to the voltage applied to the second node.

16 Claims, 8 Drawing Sheets

(56) References Cited

U.S. PATENT DOCUMENTS

2008/0048712 A1\* 2/2008 Ahn .................... G09G 3/3677
326/21
2008/0088555 A1\* 4/2008 Shin .................... G09G 3/3677
345/87

FOREIGN PATENT DOCUMENTS

| KR | 10-2014-0067549 A | 6/2014 |
| KR | 10-2014-0096613 A | 8/2014 |

\* cited by examiner

GATE DRIVING CIRCUIT AND DISPLAY DEVICE INCLUDING THE SAME

CROSS-REFERENCE TO RELATED APPLICATION

This patent application claims priority to and the benefit of Korean Patent Application No. 10-2015-0062091, filed on Apr. 30, 2015, the entire content of which is hereby incorporated by reference herein.

BACKGROUND

Aspects of embodiments of the present invention relate to a gate driving circuit and a display device including the same.

A display device includes a plurality of gate lines, a plurality of data lines, and a plurality of pixels connected to the plurality of gate lines and the plurality of data lines. The display device includes a gate driving circuit being configured to sequentially provide gate signals to the plurality of gate lines, and a data driving circuit being configured to output data signals to the plurality of data lines.

The gate driving circuit includes a shift resistor having a plurality of driving stages. The plurality of driving stages respectively output gate signals corresponding to the plurality of gate lines. Each of the plurality of driving stages includes a plurality of transistors systematically connected to each other.

The above information disclosed in this Background section is only for enhancement of understanding of the background of the invention and therefore it may contain information that does not constitute prior art.

SUMMARY

Aspects of embodiments of the present invention relate to a gate driving circuit and a display device including the same, and to a gate driving circuit having excellent operating characteristics and a display device having excellent display qualities.

Aspects of embodiments of the present invention include a gate driving circuit capable of preventing or reducing instances of a delay of a gate signal outputted.

Aspects of embodiments of the present invention include a display device with reduced transverse line observation.

According to some embodiments of the present invention, a gate driving circuit includes a plurality of driving stages configured to respectively output gate signals and connected to each other in a cascade structure, wherein an n-th driving stage (where n is an integer of 3 or more) of the plurality of driving stages includes: a first control transistor including a first terminal connected to a first input terminal and a second terminal connected to a first node, and configured to increase a voltage of the first node to a first voltage when being turned on according to a signal applied to the first input terminal; a control capacitor having a first end connected to the first node; a second control transistor including a first terminal connected to a second input terminal and a second terminal connected to a second end of the control capacitor, and configured to increase the first voltage of the first node to a second voltage that is higher than the first voltage when being turned on according to a signal applied to the second input terminal; a third control transistor including a control terminal connected to the first node, a first terminal connected to the second input terminal, and a second terminal connected to a second node, and configured to increase a voltage of the second node to a third voltage when being turned on according to a voltage applied to the first node; and an output transistor including a control terminal connected to the second node, a first terminal connected to a first clock terminal, and a second terminal connected to an output terminal, and the output transistor being configured to output the gate signal of the n-th driving stage to the output terminal when being turned on according to the voltage applied to the second node.

The first input terminal may be configured to receive a control signal of an (n−2)-th driving stage, and the second input terminal may be configured to receive a control signal of an (n−1)-th driving stage.

A control terminal of the first control transistor may be connected to the first input terminal, and a control terminal of the second control transistor may be connected to the second input terminal.

The n-th driving stage may further include an output capacitor comprising a first end connected to the output terminal, and a second end connected to the second node, the output capacitor being configured to increase the voltage of the second node from the third voltage to a fourth voltage that is higher than the third voltage while the gate signal of the n-th driving stage is outputted.

The second voltage may be higher than the sum of a voltage of the signal applied to the second input terminal and a threshold voltage of the third control transistor.

The n-th driving circuit may further include: a first voltage input terminal configured to receive a first low-level voltage; a second voltage input terminal configured to receive a second low-level voltage that is lower than the first low-level voltage; and a first pull-down transistor comprising a control terminal connected to the first clock terminal, a first terminal connected to the first node, and a second terminal connected to the second voltage input terminal, the first pull-down transistor being configured to pull down the voltage of the first node to the second ground voltage according to a signal applied to the first clock terminal, and to float the second node during outputting of the gate signal.

The n-th driving stage may further include a second pull-down transistor comprising a control terminal connected to a second clock terminal, a first terminal connected to the first voltage input terminal, and a second terminal connected to the second terminal of the output transistor, the second pull-down transistor being configured to pull down a voltage of the output terminal to the first ground voltage according to a signal applied to the second clock terminal.

The n-th driving stage may further include: a first holding transistor comprising a control terminal connected to a third clock terminal, a first terminal connected to the first voltage input terminal, and a second terminal connected to the output terminal, and a second holding transistor comprising a control terminal connected to the third clock terminal, a first terminal connected to the second voltage input terminal, and a second terminal connected to the second node, the first holding transistor being configured to hold a voltage of the output terminal as the first ground voltage according to a signal applied to the third clock terminal, and the second holding transistor being configured to hold a voltage of the second node as the second ground voltage according to the signal applied to the third clock terminal.

The first clock terminal may be configured to receive a high-level voltage during an n-th section, the second clock terminal is configured to receive a high-level voltage during an (n+1)-th section, and the third clock terminal may be configured to receive a high-level voltage during an (n+2)-th section.

The n-th driving stage may further include a control transistor including a control terminal connected to the second node, a first terminal connected to the first clock terminal, and a second terminal connected to a carrying terminal, and configured to output a control signal of the n-th driving stage according to the signal of the first clock terminal.

According to some example embodiments of the present invention, a display device includes: a display panel comprising a plurality of gate lines, a plurality of data lines crossing the gate lines, and a plurality of pixels respectively connected to corresponding ones of the gate lines and corresponding ones of the data lines; a data driving circuit configured to provide data signals to the plurality of data lines; and a gate driving circuit comprising a plurality of driving stages connected to each other in a cascade structure, and configured to provide a gate signal to the gate lines, wherein an n-th driving stage (where n is an integer of 3 or more) of the plurality of driving stages comprises: a first control transistor comprising a first terminal connected to a first input terminal and a second terminal connected to a first node and configured to increase a voltage of the first node to a first voltage when being turned on according to a signal applied to the first input terminal; a control capacitor having a first end connected to the first node; a second control transistor comprising a first terminal connected to a second input terminal and a second terminal connected to a second end of the control capacitor and configured to increase the first voltage of the first node to a second voltage that is higher than the first voltage when being turned on according to a signal applied to the second input terminal; a third control transistor comprising a control terminal connected to the first node, a first terminal connected to the second input terminal, and a second terminal connected to a second node and configured to increase a voltage of the second node to a third voltage when being turned on according to a voltage applied to the first node; and an output transistor comprising a control terminal connected to the second node, a first terminal connected to a first clock terminal, and a second terminal connected to an output terminal, the output transistor being configured to output a gate signal of the n-th driving stage to the output terminal when being turned on according to the voltage applied to the second node.

The first input terminal may be configured to receive a control signal of an (n−2)-th driving, and the second input terminal is configured to receive a control signal of an (n−1)-th driving stage.

The second voltage may be higher than the sum of a voltage of the signal applied to the second input terminal and a threshold voltage of the third control transistor.

The n-th driving stage may further include a pull-down transistor including a control terminal connected to the first clock terminal, a first terminal connected to the first node, and a second terminal connected to a voltage input terminal, the pull-down transistor being configured to pull down the voltage of the first node according to a signal applied to the first clock terminal, to float the second node during outputting of the gate signal.

A control terminal of the first control transistor may be connected to the first input terminal, and a control terminal of the second control transistor may be connected to the second input terminal.

The n-th driving stage may further include an output capacitor comprising a first end connected to the output terminal, and a second end connected to the second node, the output capacitor being configured to increase the voltage of the second node from the third voltage to a fourth voltage that is higher than the third voltage while the gate signal of the n-th driving stage is outputted.

BRIEF DESCRIPTION OF THE FIGURES

The accompanying drawings are included to provide a further understanding of aspects of embodiments of the present invention, and are incorporated in and constitute a part of this specification. The drawings illustrate example embodiments of the present invention and, together with the description, serve to explain principles of the present invention. In the drawings.

DETAILED DESCRIPTION

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Figure 1:
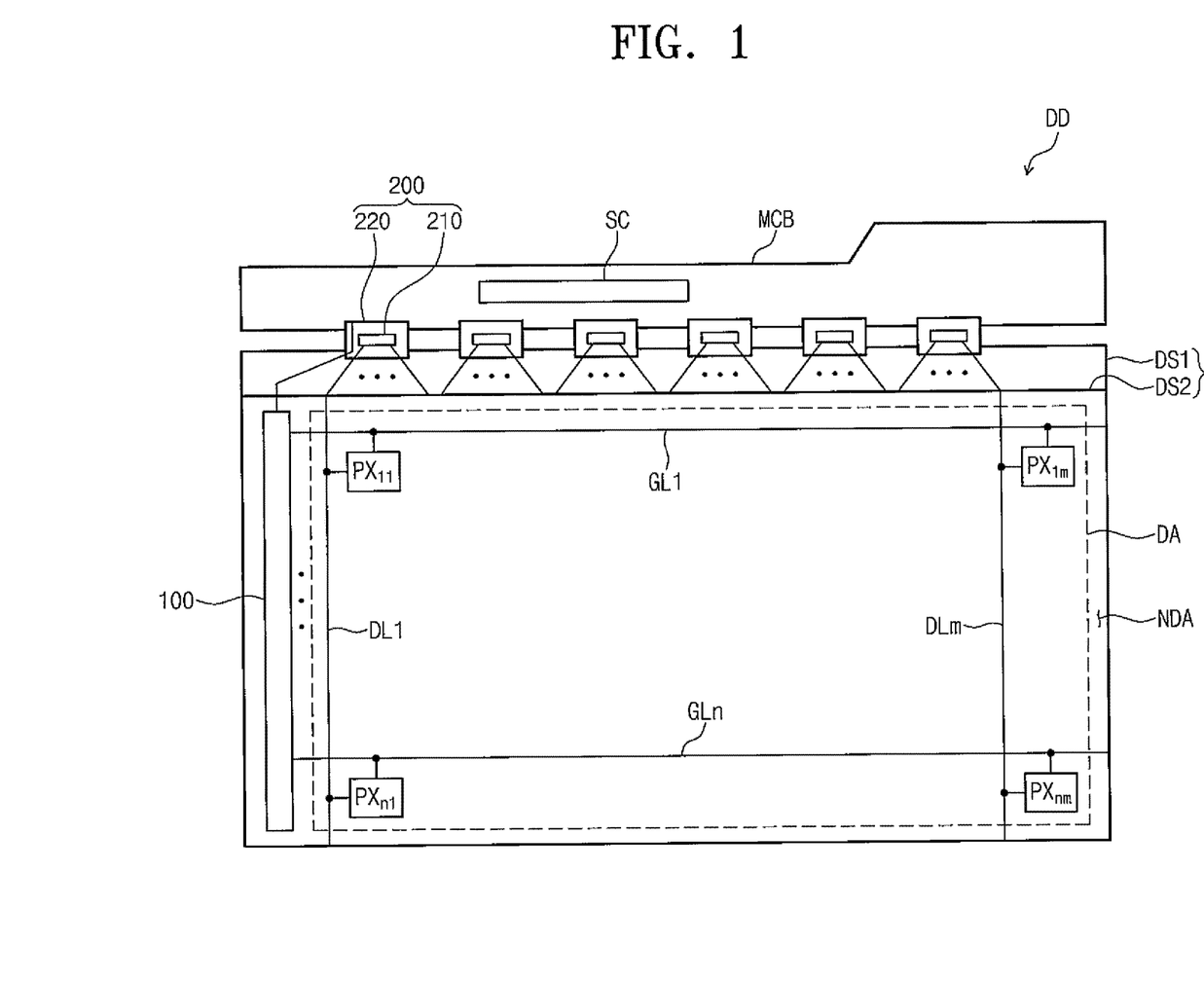
FIG. 1 is a plan view of a display device according to an embodiment of the present invention.

FIG. 1 is a plan view of a display device according to an embodiment of the present invention.

Referring to FIG. 1, a display device DD includes a display panel DP, a gate driving circuit 100, and a data driving circuit 200.

The display panel DP may include, although is not limited to, various suitable display panels such as a liquid crystal display panel, an organic light emitting display panel, an electrophoretic display panel, and an electrowetting display panel. In the current embodiment, the display panel DP is described as being a liquid crystal display panel, but embodiments of the present invention are not limited thereto. A liquid crystal display device including the liquid crystal display panel may further include a polarized light device, a backlight unit, and/or the like.

The display panel DP may include a first substrate DS1, a second substrate DS2 spaced apart from the first substrate DS1, and a liquid crystal layer (LCL of FIG. 3) arranged between the first substrate DS1 and the second substrate DS2. In a plan view, the display panel DP may include a display area DA in which a plurality of pixels $PX_{11}$ to $PX_{nm}$ are arranged, and a non-display area NDA surrounding the display area DA.

The display panel DP may include a plurality of gate lines GL1 to GLn arranged on the first substrate DS1, and a plurality of data lines DL1 to DLm crossing the gate lines GL1 to GLn. The plurality of gate lines GL1 to GLn are connected to the gate driving circuit. The plurality of data lines DL1 to DLm are connected to the data driving circuit 200. FIG. 1 illustrates only a part of the plurality of gate lines GL1 to GLn and a part of the plurality of data lines DL1 to DLm. Moreover, the display panel DP may further include dummy gate lines (GL_D1 and GL_D2 of FIG. 4) arranged in the non-display area NDA of the first substrate DS1.

FIG. 1 illustrates only a part of the plurality of pixels $PX_{11}$ to $PX_{nm}$. The plurality of pixels $PX_{11}$ to $PX_{nm}$ are respectively connected to corresponding gate lines of the plurality of gate lines GL1 to GLn and corresponding data lines of the plurality of data lines DL1-DLm. However, the dummy gate lines (GL_D1 and GL_D2 of FIG. 4) are not connected to the plurality of pixels $PX_{11}$ to $PX_{nm}$.

The plurality of pixels $PX_{11}$ to $PX_{nm}$ may be divided into a plurality of groups by display color. The plurality of pixels $PX_{11}$ to $PX_{nm}$ may display one of a plurality of primary colors. The primary colors may include red, green, blue, and/or white. The primary colors may further include, although not limited to, various colors such as yellow, cyan, and/or magenta.

The gate driving circuit 100 and data driving circuit 200 receive a control signal from a signal control unit SC. The signal control unit SC may be mounted on a main circuit board MCB. The signal control unit SC receives image data and a control signal from an external graphic control unit. The control signal may include: a vertical synchronization signal discriminating (or distinguishing) different frame sections; a signal discriminating (or distinguishing) different horizontal sections; that is, a horizontal synchronization signal discriminating (or distinguishing) different lines; a data enable signal which is at a high level only in a section during which data are outputted to display a region where data are inputted; and/or clock signals.

The gate driving circuit 100 generates gate signals on the basis of the control signal (hereinafter, gate control signal) received from the signal control unit SC during the frame sections, and outputs the gate signals to the plurality of gate lines GL1 to GLn. The gate signals may be sequentially outputted corresponding to the horizontal sections. For example, the gate driving circuit 100 may be mounted on the non-display area NDA in a form of an amorphous silicon TFT gate drive circuit (ASG).

FIG. 1 illustrates an example of one gate driving circuit 100 connected to left terminals of a plurality of gate lines GL1 to GLn. In some embodiments of the present invention, a display device DD may include two gate driving circuits. One of the two gate driving circuits may be connected to the left terminals of the plurality of gate lines GL1 to GLn, and the other may be connected to right terminals of the plurality of gate lines GL1 to GLn. Moreover, one of the two gate driving circuits may be connected to odd-numbered gate lines, and the other may be connected to even-numbered gate lines.

A data driving circuit 200 may generate gray-scale voltages according to image data provided from a signal control unit SC on the basis of a control signal (hereinafter, data control signal) received from the signal control unit SC. The data driving circuit 200 outputs the gray-scale voltages as data voltages to a plurality of data lines DL1 to DLm.

The data voltages may include positive data voltages having a positive value, and/or negative data voltages having a negative value, with respect to a common voltage. Some of the data voltages applied to the data lines DL1 to DLm during each of horizontal sections may have a positive polarity, and the other may have a negative polarity. The polarities of the data voltages may be inverted according to the frame sections to prevent the degradation of a liquid crystal. In response to an inversion signal, the data driving circuit 200 may generate data voltages that are inverted in frame section units.

The data driving circuit 200 may include a driving chip 210 and a flexible circuit board 220 having the drive chip 210 mounted thereon. The data driving circuit 200 may include a plurality of driving chips 210 and a flexible circuit board 220. The flexible circuit board 220 electrically connects a main circuit board MCB and a first substrate DS1. The plurality of driving chips 210 provide data signals corresponding to corresponding data lines of the plurality of data lines DL1 to DLm.

FIG. 1 illustrates an example of a data driving circuit 200 of a tape carrier package (TCP) configuration. In some embodiments of the present invention, the data driving circuit 200 may be arranged on a non-display area NDA of the first substrate DS1 through a chip on glass (COG) technique.

Figure 2:
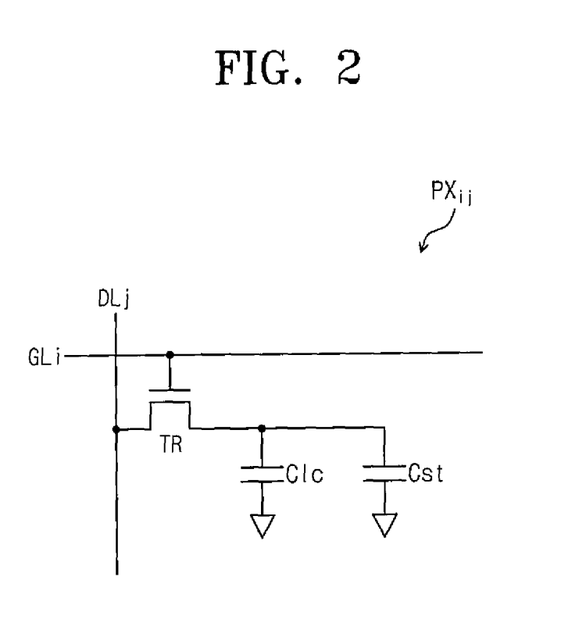
FIG. 2 is an equivalent circuit diagram of a pixel according to an embodiment of the present invention.
Figure 3:
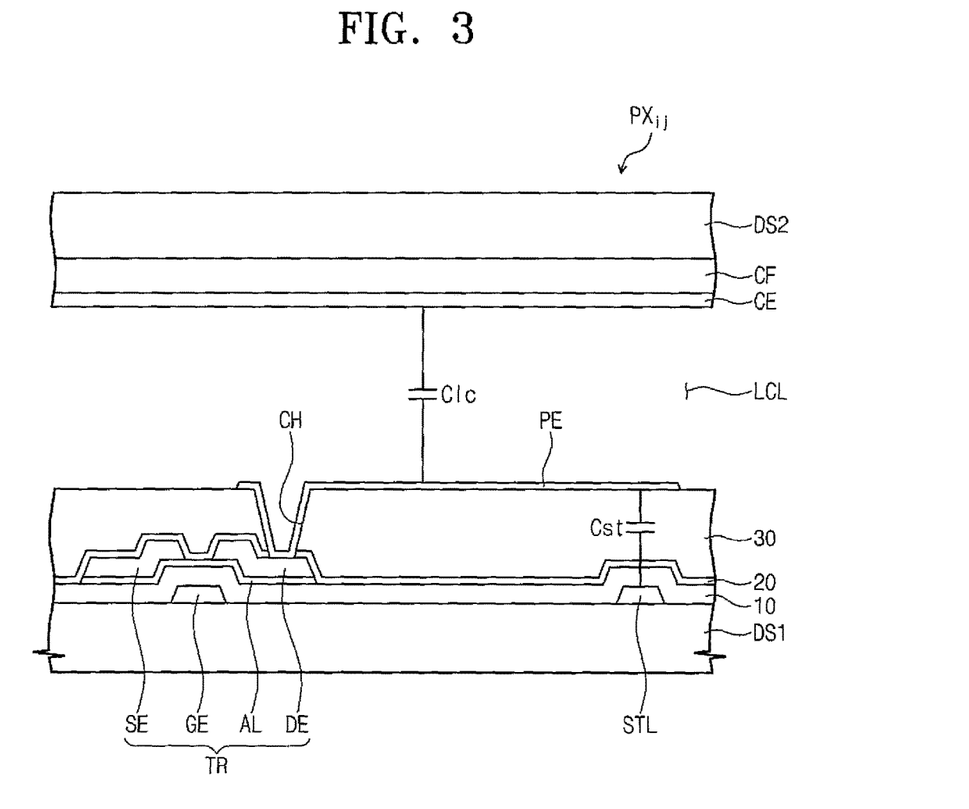
FIG. 3 is a cross-sectional view of a pixel according to an embodiment of the present invention.

FIG. 2 is an equivalent circuit diagram of a pixel according to an embodiment of the present invention, and FIG. 3 is a cross-sectional view of a pixel according to an embodiment of the present invention. Each of a plurality of pixels $PX_{11}$ to $PX_{nm}$ illustrated in FIG. 1 may have an equivalent circuit as illustrated in FIG. 2.

As illustrated in FIGS. 2 and 3, a pixel $PX_{ij}$ may include a pixel transistor TR, a liquid crystal capacitor Clc, and a storage capacitor Cst. Hereinafter, a transistor herein may refer to a thin film transistor. The storage capacitor Cst may be omitted in an embodiment of the inventive concept.

The pixel transistor TR may be electrically connected to an i-th gate line GLi and a j-th data line DLj. The pixel transistor TR may output a pixel voltage corresponding to the data signal received from the j-th data line DLj, in response to a gate signal received from the i-th gate line GLi.

The liquid crystal capacitor Clc may charge a pixel voltage outputted from the pixel transistor TR. The arrangement of liquid crystal directors included in the liquid crystal layer LCL varies with a charge amount accumulated in the liquid crystal capacitor Clc. Light entering the liquid crystal layer LCL according to the arrangement of the liquid crystal directors may be transmitted or blocked.

The storage capacitor Cst may be connected to the liquid crystal capacitor Clc in parallel. The storage capacitor Cst may maintain the arrangement of the liquid crystal director during a section (e.g., a predetermined section).

The pixel transistor TR may include a control electrode GE connected to the i-th gate line GLi, an activation part AL overlapping the control electrode GE, a first electrode SE connected to the j-th data line DLj, and a second electrode DE spaced apart from the first electrode SE.

The liquid crystal capacitor Clc may include a pixel electrode PE and a common electrode CE. The storage capacitor Cst may include the pixel electrode PE and a part of a storage line STL overlapping the pixel electrode PE.

The i-th gate line GLi and storage line STL may be arranged on one surface of the first substrate DS1. The control electrode GE may be branched from the i-th gate line GLi. The i-th gate line GLi and storage line STL may include a metal such as aluminum (Al), silver (Ag), copper (Cu), molybdenum (Mo), chrome (Cr), tantalum (Ta), titanium (Ti), or an alloy thereof. The i-th gate line GLi and storage line STL may include a multilayer structure, and for example, include a titanium layer and a copper layer.

A first insulating layer 10 covering the control electrode GE and storage line STL may be arranged on one surface of the first substrate DS1. The first insulating layer 10 may include at least any one of an inorganic material or an organic material. The first insulating layer 10 may be an organic film or an inorganic film. The first insulating layer 10 may include a multilayer structure, for example, a silicon nitrite layer and a silicon oxide layer.

The activation part AL overlapping the control electrode GE may be arranged on the first insulating layer 10. The activation part AL may include a semiconductor layer and an ohmic contact layer. The semiconductor layer may be arranged on the first insulating layer 10, and the ohmic contact layer may be arranged on the semiconductor layer. The semiconductor layer may include amorphous silicon or polysilicon. Moreover, the semiconductor layer may include a metal oxide semiconductor. The ohmic contact layer may be more highly doped with a dopant than that of the semiconductor layer.

The second electrode DE and first electrode SE may be arranged on the activation part AL. The second electrode DE and the first electrode SE may be spaced apart from each other. Each of the second electrode DE and the first electrode SE may partially overlap the control electrode GE in a plan view.

A second insulating layer 20 covering the activation part AL, the second electrode DE, and the first electrode SE may be arranged on the first insulating layer 10. The second insulating layer 20 may include at least any one of an inorganic material or an organic material. The second insulating layer 20 may be an organic film or an inorganic film. The second insulating layer 20 may include a multilayer structure, and for example, may include a silicon nitride layer and a silicon oxide layer.

A third insulating layer 30 may be arranged on the second insulating layer 20. The third insulating layer 30 may provide a flat surface. The third insulating layer 30 may include an organic material.

The pixel electrode PE may be arranged on the third insulating layer 30. The pixel electrode PE may be connected to the second electrode DE through a contact hole CH penetrating through the second insulating layer 20 and third insulating layer 30. An alignment film covering the pixel electrode PE may be arranged on the third insulating layer 30.

A color filter layer CF may be arranged on one surface of the second substrate DS2. The common electrode CE may be arranged on the color filter layer CF. A common voltage may be applied to the common electrode CE. The common voltage and pixel voltage may have different values. An alignment film covering the common electrode CE may be arranged on the common electrode CE. Another insulating layer may be arranged between the color filter layer CF and the common electrode CE.

The pixel electrode PE and common electrode CE arranged with the liquid crystal layer LCL therebetween may form the liquid crystal capacitor Clc. Moreover, portions of the pixel electrode PE and the storage line STL, which are arranged with the first insulating layer 10, the second insulating layer 20, and the third insulating layer 30 therebetween, may form a storage capacitor Cst. The storage line STL may receive a storage voltage having a different value from that of the pixel voltage. The storage voltage may have the same value as the common voltage.

A cross-section of the pixel $PX_{ij}$ illustrated in FIG. 3 may be just an example. In contrast to the illustration in FIG. 3, at least any one of the color filter layer CF or common electrode CE may be arranged on the first substrate DS1. In other words, the liquid crystal panel according to the embodiment may include pixels of a vertical alignment (VA) mode, a patterned vertical alignment (PVA) mode, an in-plane switching (IPS) or fringe-field switching (FFS) mode, a plane to line switching (PLS) mode, and/or the like.

Figure 4:
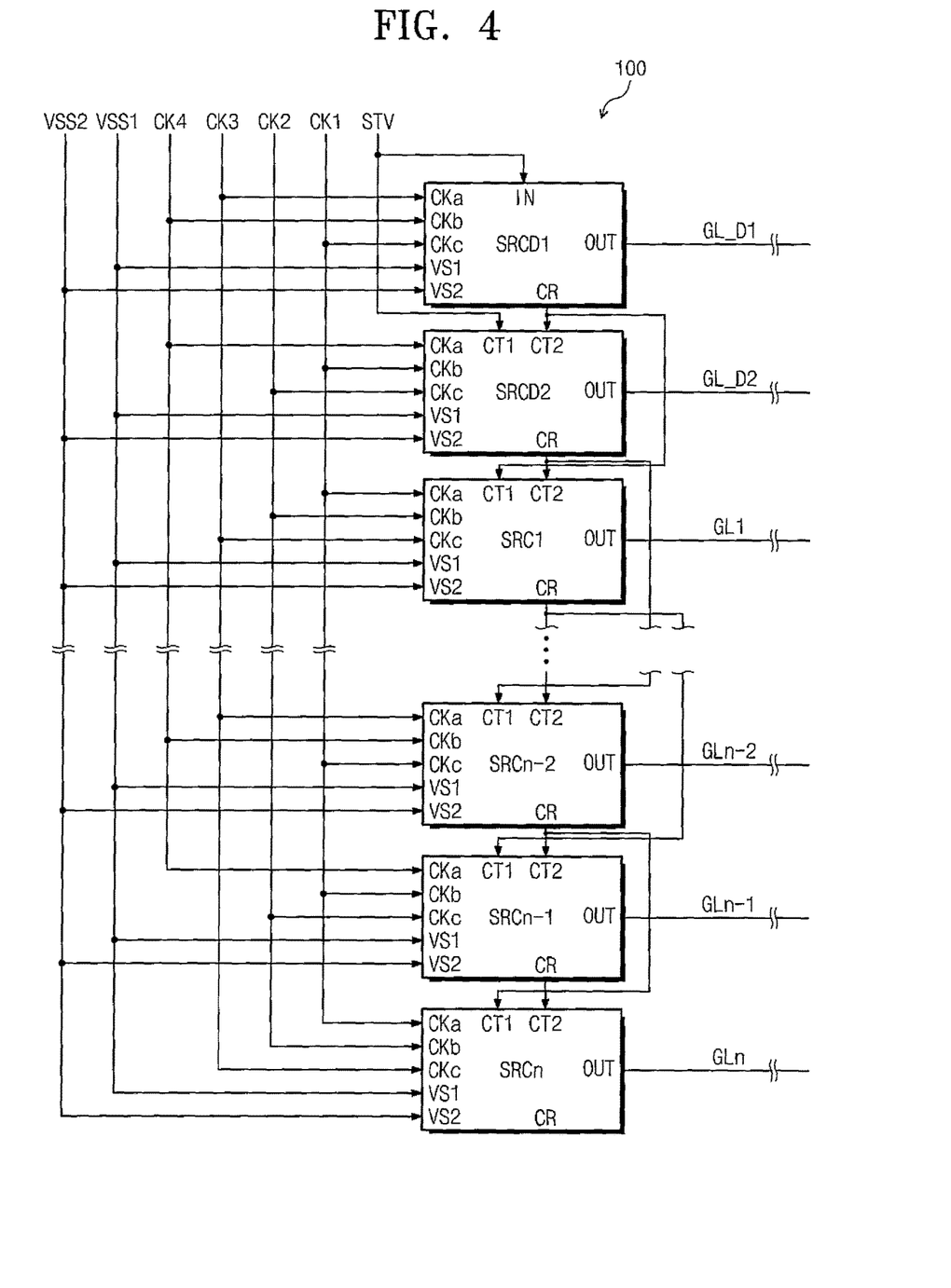
FIG. 4 is a block diagram of a gate driving circuit according to an embodiment of the present invention.

FIG. 4 is a block diagram of a gate driving circuit according to an embodiment of the present invention. As illustrated in FIG. 4, the gate driving circuit 100 may include a plurality of driving stages SRC1 to SRCn. The plurality of driving stages SRC1 to SRCn are connected to each other in cascade.

In the current embodiment, the plurality of driving stages SRC1 to SRCn are respectively connected to a plurality of gate lines GL1 to GLn. The plurality of driving stages SRC1 to SRCn respectively provide gate signals to the plurality of gate lines GL1 to GLn.

The gate driving circuit 100 may be positioned at a front stage of the plurality of driving stages SRC1 to SRCn, and may further include a first dummy driving stage SRCD1 connected to a first driving stage SRC1, and a second dummy driving stage SRCD2. The first dummy driving stage SRCD1 may be connected to a first dummy gate line GL-D1, and the second dummy driving stage SRCD2 may be connected to a second dummy gate line GL-D2.

Each of the plurality of driving stages SRC1 to SRCn may include an output terminal OUT, a carry terminal CR, a first input terminal CT1, a second input terminal CT2, a first clock terminal CKa, a second clock terminal CKb, a third clock terminal CKc, a first voltage input terminal VS1, and a second voltage input terminal VS2.

The output terminal OUT of each of the plurality of driving stages SRC1 to SRCn may be connected to corresponding gate lines of the plurality of gate lines GL1 to GLn. Gate signals generated from the plurality of driving stages SRC1 to SRCn may be provided to the plurality of gate lines GL1 to GLn through the output terminal OUT.

The carry terminal CR of each of the plurality of driving stages SRC1 to SRCn may output a control signal. The carry terminal CR of each of the plurality of driving stages SRC1 to SRCn may be electrically connected to the second input terminal CT2 of a driving stage next to the corresponding driving stage and the first input terminal CT1 of a driving stage after next.

The first input terminal CT1 of each of the plurality of driving stages SRC1 to SRCn may receive a control signal of a driving stage second before the corresponding driving stage. The second input terminal CT2 of each of the plurality of driving stages SRC1 to SRCn may receive a control signal of a driving stage before the corresponding driving stage.

For example, the first input terminal CT1 of an n-th driving stage SRCn may receive a control signal of an (n−2)-th driving stage SRCn−2. The second input terminal CT2 of an n-th driving stage SRCn may receive a control signal of an (n−1)-th driving stage SRCn−1.

An input terminal IN of the first dummy driving stage SRCD1 may receive an initiating signal SW that initiates driving of the gate driving circuit 100. The carry terminal CR of the first dummy driving stage SRCD1 may be electrically connected to the second input terminal CT2 of the second dummy driving stage SRCD2 and the first input terminal CT1 of the first driving stage SRC1. The first input terminal CT1 of the second dummy driving stage SRCD2 may receive the initiating signal STV, and the second input terminal CT2 of the second dummy driving stage SRCD2 may receive a control signal of the first dummy driving stage SRCD1. The first input terminal CT1 of the first driving stage SRC1 may receive the control signal of the first dummy driving stage SRCD1, and the second input terminal CT2 of the first driving stage SRC1 may receive a control signal of the second dummy driving stage SRCD2.

The first clock terminal CKa of each of the plurality of driving stages SRC1 to SRCn may receive any one of first to fourth clock signals CK1 to CK4, the second clock terminal CKb may receive another one of the first to fourth clock signals CK1 to CK4, and the third clock terminal CKc may receive further another one of the first to fourth clock signals CK1 to CK4.

For example, the first clock terminal CKa of an (n–2)-th driving stage SRCn–2 may receive the third clock signal CK3, the second clock terminal CKb of an (n–2)-th driving stage SRCn–2 may receive the fourth clock signal CK4, and the third clock terminal CKc of the (n–2)-th driving stage SRCn–2 may receive the first clock signal CK1. The first clock terminal CKa of an (n–1)-th driving stage CRCn–1 may receive the fourth clock signal CK4, the second clock terminal CKb of an (n–1)-th driving stage CRCn–1 may receive the first clock signal CK1, and the third clock terminal CKc of an (n–1)-th driving stage CRCn–1 may receive the second clock signal CK2. The first clock terminal CKa of an n-th driving stage SRCn may receive the first clock signal CK1, the second clock terminal CKb of an n-th driving stage SRCn may receive the second clock signal CK2, and the third clock terminal CKc of an n-th driving stage SRCn may receive the third clock signal CK3.

The first voltage input terminal VS1 of each of the plurality of driving stages SRC1 to SRCn may receive a first ground voltage (or first low-level voltage) VSS1. The second voltage input terminal VS2 of each of the plurality of driving stages SRC1 to SRCn may receive a second ground voltage (or second low-level voltage) VSS2. The second ground voltage VSS2 may be smaller than the first ground voltage VSS1. The first ground voltage VSS1 and the second ground voltage VSS2 may be ground voltages. According to some embodiments, one or both of the first ground voltage VSS1 and the second ground voltage VSS2 may be negative voltages having a negative value.

In another embodiment of the present invention, according to a circuit configuration, each of a plurality of driving stages SRC1 to SRCn may exclude any one of an output terminal OUT, a first input terminal CT1, a second input terminal CT2, a carry terminal CR, a first clock terminal CKa, a second clock terminal CKb, a third clock terminal CKc, a first voltage input terminal VS1, and a second voltage input terminal VS2, or may further include other terminals. For example, any one of the first voltage input terminal VS1 and second voltage input terminal VS2 may be omitted.

Figure 5:
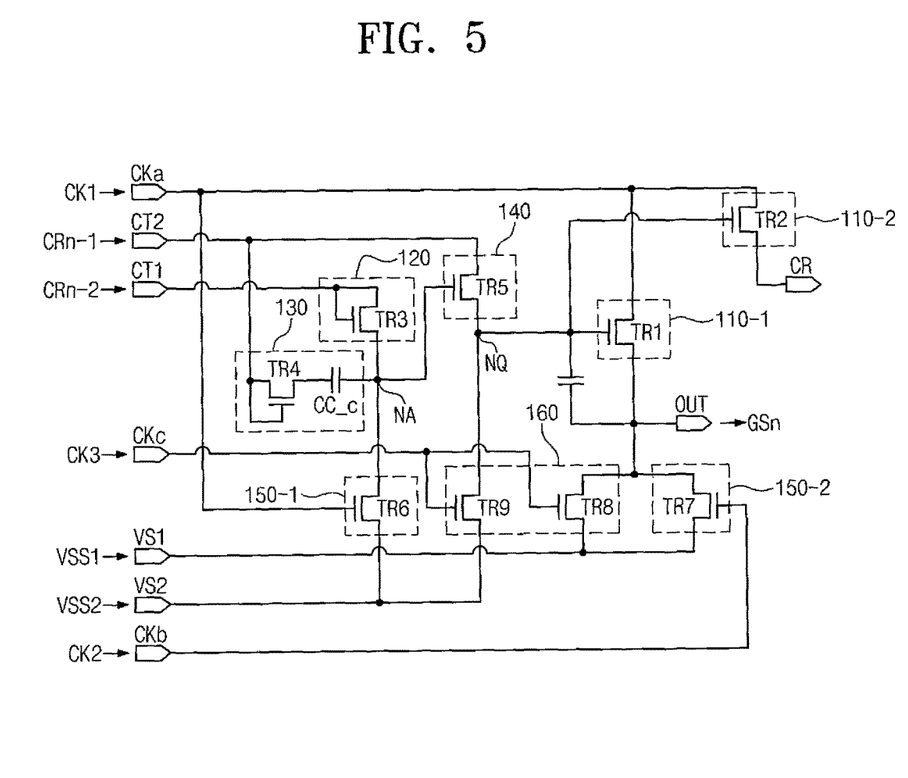
FIG. 5 is a circuit diagram of an n-th driving stage of a plurality of driving stages illustrated in FIG. 4.
Figure 6:
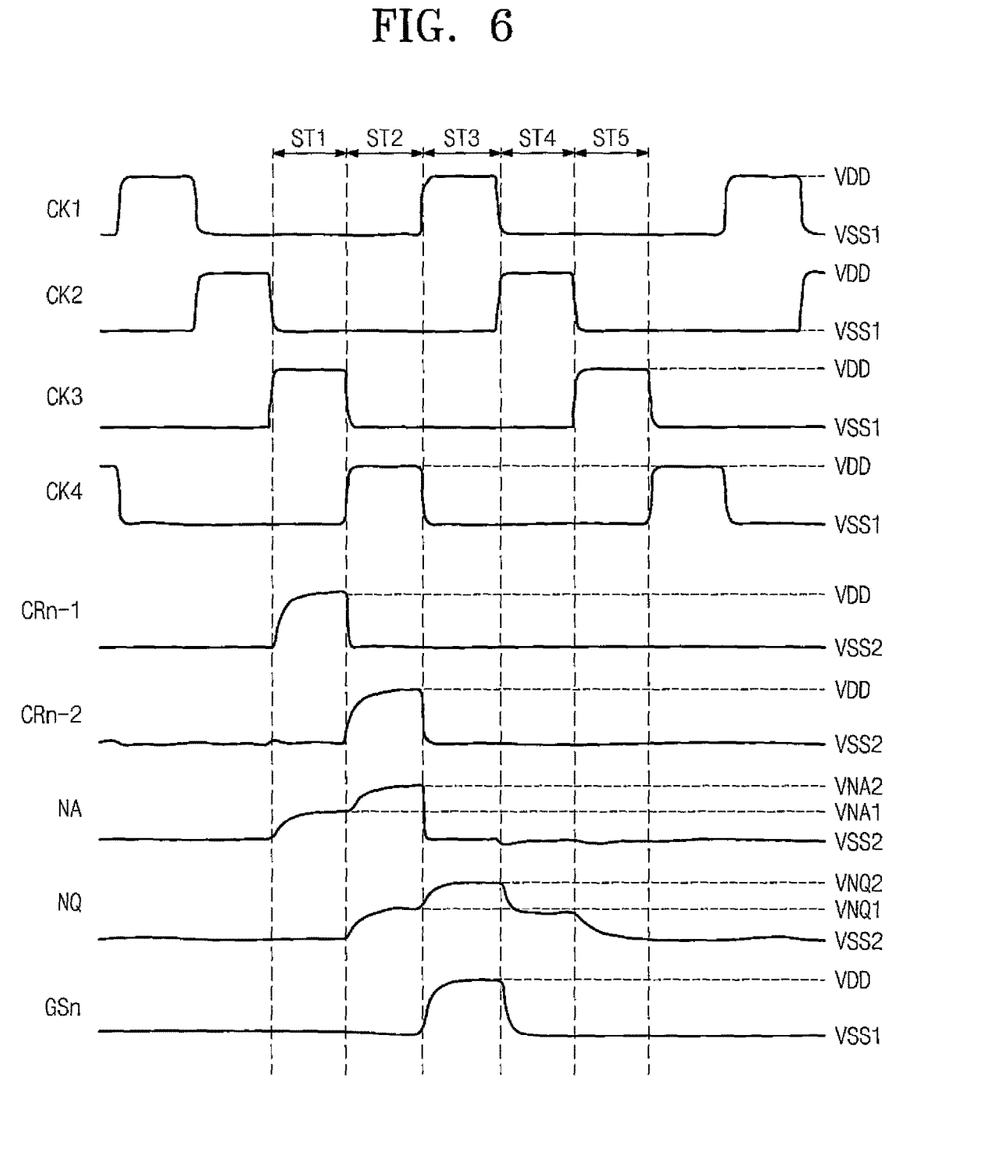
FIG. 6 is a waveform diagram illustrating input and output signals of the n-th driving stage illustrated in FIG. 5.

FIG. 5 is a circuit diagram illustrating an n-th driving stage of a plurality of driving stages illustrated in FIG. 4, and FIG. 6 is a waveform diagram illustrating input and output signals of the n-th driving stage illustrated in FIG. 5. Each of the plurality of driving stages SRC1 to SRCn illustrated in FIG. 4 may have the same or similar circuit as an n-th driving stage SRCn.

Referring to FIGS. 5 and 6, the n-th driving stage SRCn may include a first output unit 110-1, a second output unit 110-2, a first control unit 120, a second control unit 130, a third control unit 140, pull down units 150-1 and 150-2, and a holding unit 160. The pull down units 150-1 and 150-2 may include a first pull down unit 150-1 configured to pull down a voltage of a first node NA, and a second pull down unit 150-2 configured to pull down a voltage of an output terminal OUT.

The first output unit 110-1 may output a gate signal GSn to an n-th gate line (GLn of FIG. 4). The first output unit 110-1 may include an output transistor TR1. The output transistor TR1 may include a control terminal connected to a second node NQ, one terminal connected to a first clock terminal CKa, and the other terminal connected to the output terminal OUT. The output transistor TR1 may be turned on according to a voltage applied to the second node NQ and thus output the gate signal GSn of the n-th driving stage SRCn to the output terminal OUT.

The second output unit 110-2 may output a control signal. In the current embodiment, because the n-th driving stage SRCn may be a final driving stage, a control signal may not be outputted. However, in another embodiment of the present invention, a dummy driving stage positioned at the end may be further included. In such a case, an n-th driving stage SRCn may provide a control signal to the dummy driving stage.

The second output unit 110-2 may include a control transistor TR2. The control transistor TR2 may include a control terminal connected to the second node NQ, one terminal connected to the first clock terminal CKa, and the other terminal connected to a carry terminal CR. The control transistor TR2 may be turned on according to the voltage applied to the second node NQ and thus output the control signal of the n-th driving stage SRCn to the carry terminal CR.

The first control unit 120 receives a control signal CRn–2 of an (n–2)-th driving stage (SRCn–2 of FIG. 4). The first control unit 120 may include a first control transistor TR3. The first control transistor TR3 may include a control terminal connected to the first input terminal CT1, one terminal connected to the first input terminal CT1, and the other end connected to the first node NA. The first control transistor TR3 may be a diode connected transistor having a control terminal and one terminal (e.g., a source or drain) connected to each other.

The first control transistor TR3 is turned on by the control signal CRn–2 of the (n–2)-th driving stage (SRCn–2 of FIG. 4) during a first section ST1. The turned-on first control transistor TR3 may increase the voltage of the first node NA to a first voltage VNA1. When the first node NA increases to the first voltage VNA1, a third control transistor TR5 may be turned on.

The second control unit 130 may receive a control signal CRn–1 of an (n–1)-th driving stage (SRCn–1 of FIG. 4). The second control unit 130 may include a second control transistor TR4 and a control capacitor CC_c. The second control transistor TR4 may include a control terminal connected to a second input terminal CT2, one terminal connected to the second input terminal CT2, and the other end connected to one end of the control capacitor CC_c. The second control transistor TR4 is a diode connected transistor having one terminal (e.g., a source or drain) and a control terminal connected to each other.

The second control transistor TR4 is turned on by the control signal SRCn-1 of the (n-1)-th driving stage SRCn-1 of FIG. 4 during a second section ST2. The turned-on second control transistor TR4 may increase a voltage of the other terminal of the second control transistor TR4 to a voltage (e.g., a predetermined voltage).

One terminal of the control capacitor CC_c is connected to the other terminal of the second control transistor TR4, and the other end of the control capacitor CC_c is connected to the first node NA. When a voltage of the other terminal of the second control transistor TR4 is increases to a voltage (e.g., a predetermined voltage), the first voltage VNA1 of the first node NA may increase to a second voltage VNA2. The second voltage VNA2 may be larger than the first voltage VNA1. The second voltage VNA2 may be larger (higher) than the sum of the voltage of the control signal CRn-1 of the (n-1)-th driving stage and a threshold voltage of the third control transistor TR5.

A principle in which the voltage of the first node NA increases to the second voltage VNA2 from the first voltage VNA1 will be described in more detail below. A case in which the first capacitor and second capacitor are serially connected may be illustrated as an example. A power source is connected to one end of the first capacitor, and the other end of the first capacitor is connected to one end of the second capacitor in series. A voltage variation between the other end of the first capacitor and one end of the second capacitor is equal to a value obtained by dividing a voltage variation of the power source by the sum of the capacitances of the first and second capacitors and then multiplying the capacitance of the first capacitor. In the current embodiment, the first capacitor may be a control capacitor CC_c, and the second capacitor may be a parasitic capacitor derived from the first control transistor TR3, the third control transistor TR5, and the like. Moreover, the node between the other end of the first capacitor and one end of the second capacitor may be the first node NA. The voltage of the first node NA may be changed as much as a value obtained by dividing a variation in a voltage level of the control signal CRn-1 of the (n-1)-th driving stage (SRCn-1 of FIG. 4) by the sum of the capacitances of the control capacitor CC_c and parasitic capacitor and then multiplying the capacitance of the control capacitor CC_c.

The third control unit 140 may receive the control signal CRn-1 of the (n-1)-th driving stage (SRCn-1 of FIG. 4). The third control unit 140 may include a third control transistor TR5. The third control transistor TR5 may include a control terminal connected to the first node NA, one terminal connected to the second input terminal CT2, and the other terminal connected to the second node NQ.

The third control transistor TR5 is turned on when a voltage having a level (e.g., a predetermined level) or higher is applied to the first node NA. In the current embodiment, the third control transistor TR5 may be turned on during the first section ST1. However, there is no change in a signal applied to one terminal of the third control transistor TR5 during the first section ST1, and therefore the voltage of the second node NQ may not be changed. The control signal CRn-1 of the (n-1)-th driving stage (SRCn-1 of FIG. 4) may increase at one terminal of the third control transistor TR5 in the second section ST2. Accordingly, the voltage of the second node NQ may increase to a third voltage VNQ1 correspondingly.

According to the current embodiment, the second voltage VNA2 applied to the control terminal of the third control transistor TR5 may be larger than the sum of the voltage of the control signal CRn-1 of the (n-1)-th driving stage and the threshold voltage of the third control transistor TR5. Accordingly, a signal having the substantially same voltage level as a voltage level applied to one terminal of the third control transistor TR5 may be transferred to the other terminal of the third control transistor TR5. That is, the third voltage VNQ1 may be substantially the same as the voltage of the control signal CRn-1 of the (n-1)-th driving stage.

The first node NA may be consecutively precharged in two steps during the first section ST1 and second section ST2. Accordingly, the third control transistor TR5 may be sufficiently turned on. As a result, a voltage may be transferred to the second node NQ without a loss as much as the threshold voltage of the voltage level applied to one terminal of the third control transistor TR5. Because the voltage level of the second node NQ may not be lost, a size of the output transistor TR1 may decrease. In such a case, an area of a non-contact area (NDA of FIG. 1) may decrease. Moreover, because the voltage level of the second node NQ may not be lost, a speed at which the output transistor TR1 is turned on may be improved. As a result, instances of a delay of the gate signal GSn may be prevented or reduced. According to the current embodiment, a delay of the gate signal GSn may be prevented or reduced, thereby preventing a transverse line from being observed along a pixel line having a low charging rate. Accordingly, a display quality of a display device (DD of FIG. 1) may be improved.

The output transistor TR1 and control transistor TR2 are turned on during the second section ST2 in which the second node NQ increases to the third voltage VNQ1. When a first clock CK1 increases during the third section ST3, the gate signal GSn and control signal may be outputted correspondingly.

One end of an output capacitor CC_o is connected to a control terminal of the output transistor TR1, and the other end of the output capacitor CC_o is connected to the other end of TR1. In other words, one end of the output capacitor CC_o is connected to the second node NQ. During the second section ST2, the output capacitor CC_o may charge a voltage corresponding to the third voltage VNQ1. When the gate signal GSn is outputted during the third section ST3, the second node NQ may be boosted to a fourth voltage VNQ2 from the third voltage VNQ1 due to the output capacitor CC_o.

The first pull down unit 150-1 receives the first clock CK1 and a second ground voltage VSS2. The first pull down unit 150-1 may include a first pull down transistor TR6. The first pull down transistor TR6 may include a control terminal connected to the first clock terminal CKa, one terminal connected to a second voltage input terminal VS2, and the other terminal connected to the first node NA. The first clock terminal CKa receives a high-level voltage during an n-th section. In other words, the first clock terminal CKa receives a high-level voltage during the third section ST3.

The first pull down transistor TR6 is turned on during the third section ST3 by the first clock CK1. When the gate signal GSn is outputted, the first pull down transistor TR6 may pull down the voltage of the first node NA to the second ground voltage VSS2. That is, when the first pull down transistor TR6 is turned on, the third control transistor TR5 having the control terminal connected to the first node NA is turned off. Accordingly, the second node NQ is floated during the third section ST3. When the voltage of the output terminal OUT increases by an electric current flowing from one terminal of the output transistor TR1 to the other terminal, the voltage of the second node NQ may increase together due to the coupling phenomenon of the output capacitor CC_o. In particular, the second node NQ may be floated, and therefore an increase in the voltage of the output terminal OUT may be transferred to the second node NQ as it is. Moreover, while the gate signal GSn is outputted, the second node NQ is floated, and thus a leakage current does not occur.

The second pull down unit 150-2 receives a second clock signal and a first ground voltage VSS1. The second pull down unit 150-2 includes a second pull down transistor TR7. The second pull down transistor TR7 may include a control terminal connected to a second clock terminal CKb, one terminal connected to a first voltage input terminal VS1, and the other terminal connected to the output terminal OUT. The second clock terminal CKb receives a high-level voltage during an (n+1)-th section. In other words, the second clock terminal CKb receives a high-level voltage during a fourth section ST4.

The second pull down transistor TR7 is turned on during the fourth section ST4 by the second clock signal CK2. The second pull down transistor TR7 pulls down the voltage of the output terminal OUT to the first ground voltage VSS1 during the fourth section ST4.

The holding unit 160 receives a third clock signal CK3, the first ground voltage VSS1, and the second ground voltage VSS2. The holding unit 160 includes a first holding transistor TR8 and a second holding transistor TR9.

The first holding transistor TR8 includes a control terminal connected to the third clock terminal CKc, one terminal connected to the first voltage input terminal VS1, and the other terminal connected to the output terminal OUT. The third clock terminal CKc receives a high-level voltage during an (n+2)-th section. In other words, the third clock terminal CKc receives a high-level voltage during the fourth section ST4. The first holding transistor TR8 is turned on by the third clock signal CK3 during a fifth section ST5. The first holding transistor TR8 is periodically turned on by the third clock signal CK3 having a periodically increasing signal in one frame. Accordingly, the output terminal OUT is periodically held at the first ground voltage VSS1.

In contrast to the current embodiment, when the voltage of the output terminal OUT is held by one control signal (for example, a control signal of a next driving stage) during one frame, a level of the gate signal GSn may fluctuate during one frame. However, in the current embodiment, by using the third clock signal CK3, the output terminal OUT may be periodically held at the first ground voltage VSS1, thereby reducing or minimizing a fluctuation of the gate signal GSn.

The second holding transistor TR9 may include a control terminal connected to the third clock terminal CKc, one terminal connected to the second voltage input terminal VS2, and the other terminal connected to the second node NQ. The second holding transistor TR9 is turned on by the third clock signal CK3 during fifth section ST5. The second holding transistor TR9 periodically holds the voltage of the second node NQ at the second ground voltage VSS2. Because the second node NQ is connected to the control terminal of the control transistor TR2, the second ground voltage VSS2 is periodically applied the carry terminal CR.

Figure 7:
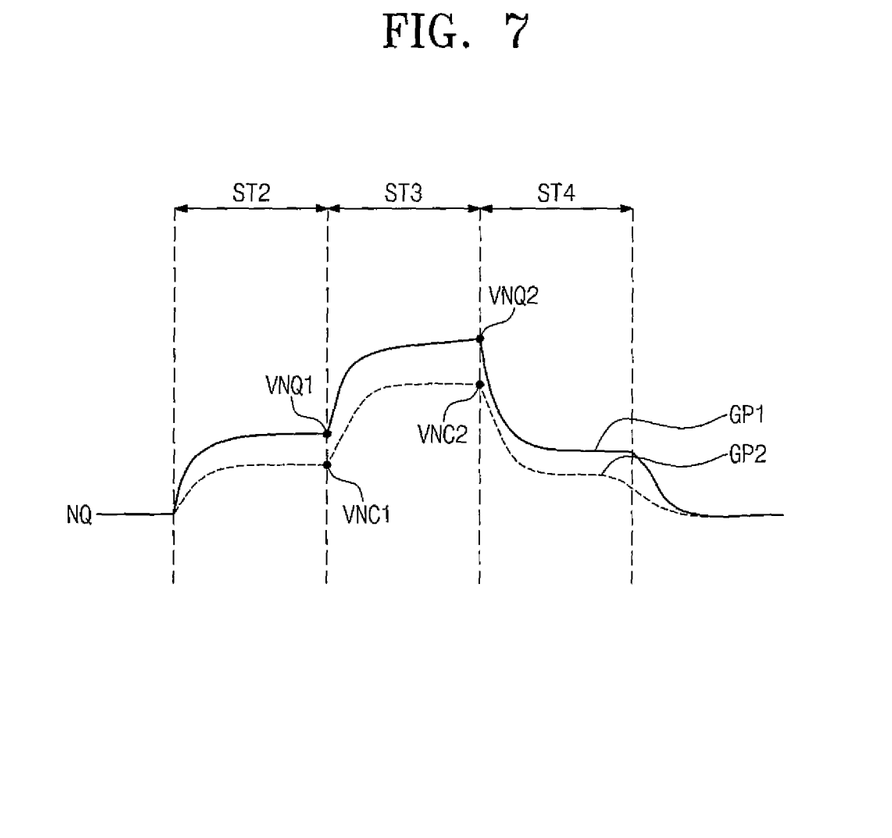
FIG. 7 is a graph showing a change in a voltage of a second node of the n-th driving stage illustrated in FIG. 5.

FIG. 7 is a graph showing a change in a voltage of the second node of the n-th driving stage illustrated in FIG. 5.

Referring to FIG. 7, a first graph GP 1 showing a first voltage change of the second node NQ according to the current embodiment and a second graph GP2 showing a second voltage change of the second node NQ according to a comparative example are shown.

Referring to the first graph GP1, the voltage of the second node NQ may increase to the third voltage VNQ1 during the second section ST2. According to the current embodiment, the voltage of the first node (NA of FIG. 5) may be larger than the sum of the voltage of the control signal (CRn−1 of FIG. 5) of the (n−1)-th driving stage (SRCn−1 of FIG. 4) and the threshold voltage of the third control transistor (TR5 of FIG. 5). Accordingly, the voltage of the control signal of the (n−1)-th driving stage may be transferred to the second node NQ as it is. The third voltage VNQ1 may be the substantially same as the voltage of the control signal (CRn−1 of FIG. 5) of the (n−1)-th driving stage (SRCn−1 of FIG. 4). That is, the voltage of the control signal (CRn−1 of FIG. 5) of the (n−1)-th driving stage (SRCn−1 of FIG. 4) may be transferred to the second node NQ as it is without a loss as much as the threshold voltage of the third control transistor (TR5 of FIG. 5).

The second graph GP2, in contrast to the embodiment of the inventive concept, is a graph achieved in the case where the voltage of the first node (NA of FIG. 5) is smaller than the sum of the voltage of the control signal (CRn−1 of FIG. 5) and the threshold voltage of the third control transistor (TR5 of FIG. 5). In such a case, a voltage applied to one terminal of the third control transistor (TR5 of FIG. 5) may be transferred to the third control transistor (TR5 of FIG. 5) after being reduced by the threshold voltage. Accordingly, the third voltage VNC1 is smaller than the third voltage VNQ1 according to an embodiment of the present invention. Moreover, because the third voltage VNQ1 is larger than the third voltage VNC1, the fourth voltage VNQ2 increased during the third section ST3 is larger than the fourth voltage VNC2. According to the current embodiment, the voltage level of the second node NQ may not be lost, and therefore a speed at which the output transistor (TR1 of FIG. 5) is turned on may be improved. As a result, instances of a delay of the gate signal (GSn of FIG. 5) may be prevented or reduced. Furthermore, the fourth voltage VNQ2 is larger than the fourth voltage VNC2, and thus a channel is more easily provided between one terminal and the other terminal of the third control transistor (TR5 of FIG. 5). Because the channel is more easily provided, resistance decreases, and resultantly the gate signal GSn is more easily outputted.

Figure 8:
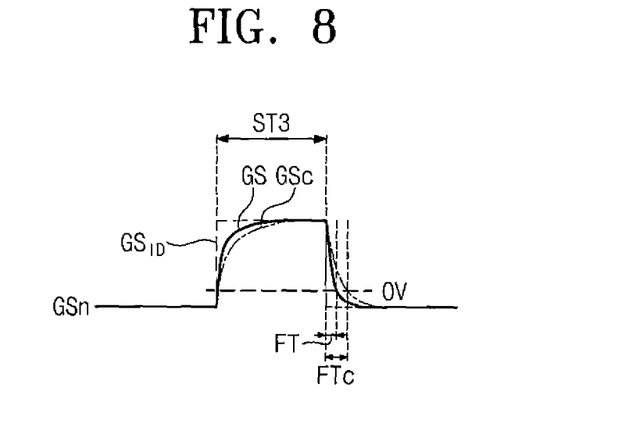
FIG. 8 is a graph showing a gate signal outputted from the n-th driving stage illustrated in FIG. 5.

FIG. 8 is a graph showing a gate signal outputted from the n-th driving stage illustrated in FIG. 5.

A first signal $GS_{ID}$ illustrated in FIG. 8 is an ideal gate signal, a second signal GS is the gate signal GSn according to the current embodiment, and a third signal GSc is a gate signal according to a comparative example. Referring to the second signal GS and third signal GSc, the first signal $GS_{ID}$ is slightly delayed due to RC-delay caused by signal wirings.

The third signal GSc is a gate signal when the second node NQ described in FIG. 7 exhibits a voltage change according to the second graph of second voltage change (GP2 of FIG. 7). In such a case, because the voltage of the control terminal of the output transistor (TR1 of FIG. 5) may slowly increase, the third signal $GS_c$ may be delayed. Accordingly, a transverse line is undesirably observed along a pixel line having a low charging rate.

However, according to the embodiment of the present invention, the second node (NQ of FIG. 5) has the third voltage (VNQ1 of FIG. 7) that has the substantially same level as the control signal (CRn−1 of FIG. 5) during the second section (ST2 of FIG. 7). Accordingly, the output transistor (TR1 of FIG. 5) may be rapidly turned on. As a result, instances of a delay of the gate signal (GSn of FIG. 5) may be prevented or reduced. Accordingly, when the first clock signal (CK1 of FIG. 6) is applied to the output transistor (TR1 of FIG. 5) during the third section ST3, the second signal GS may be outputted to the output terminal OUT without a great delay.

For example, delay time may be defined as time during which a peak voltage decreases to 0V. Here, the delay time FT of the second signal GS may be 90% or less of the delay time FTc of the third signal GSc. More specifically, the delay time FTc of the third signal GSc may be 2.08 us, and the delay time FT of the second signal GS may be 1.86 us.

According to the current embodiment, a delay of the gate signal may be alleviated. Accordingly, data may be sufficiently charged, and a transverse line is prevented from being observed. Moreover, it may be unnecessary to increase the size of the output transistor (TR1 of FIG. 5) to reduce the rising and falling times of the gate signal. Accordingly, a narrow bezel may be more easily realized.

Figure 9:
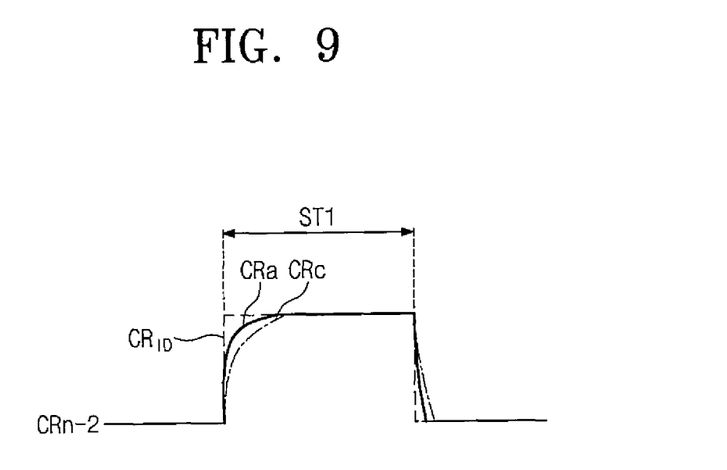
FIG. 9 is a graph showing a control signal inputted from an (n−2)-th driving stage illustrated in FIG. 5.

FIG. 9 is a graph showing a control signal inputted from an (n−2)-th driving stage illustrated in FIG. 5. The (n−2)-th driving stage may have the substantially same circuit as the n-th driving stage. In the current embodiment, description will be made with the (n−2)-th control signal as an example.

Referring to FIG. 9, a first signal $CR_{ID}$ may be a control signal, a second signal CRa may be a control signal according to the current embodiment, and a third signal CRc may be a control signal according to a comparative example. As described above, the third voltage (VNQ1 of FIG. 6) of the second node (NQ of FIG. 5) may have the substantially same level as the control signal of the previous driving stage. Accordingly, the control transistor (TR2 of FIG. 5) is sufficiently (effectively) turned on. As a result, compared to the third signal CRc according to the comparative example, the rising and falling times of the second signal CRa may decrease. Accordingly, a delay of the driving of the next driving stage may be reduced or prevented.

The first node may be precharged by the control signal of the (n−2)-th driving stage and the control signal of the (n−1)-th driving stage. That is, the first node may be precharged twice, thereby allowing the transistor configured to precharge the second node to be sufficiently turned on. Accordingly, a voltage having the substantially same level as that of the control signal of the (n−1)-th driving stage may be applied to the second node. As a result, the voltage of the second node may be maintained to sufficiently turn on the output transistor. As a result, the n-th gate signal and control signal may not be delayed.

It will be understood that although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Although embodiments have been described with reference to a number of illustrative embodiments thereof, it should be understood that numerous other modifications and embodiments can be devised by those skilled in the art that will fall within the spirit and scope of the principles of this disclosure. Thus, the scope of the present invention should not be construed as limited to the embodiments set forth herein but is to be determined by the broadest permissible interpretation of the following claims, and their equivalents.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A gate driving circuit comprising a plurality of driving stages configured to respectively output gate signals and connected to each other in a cascade structure,
   wherein an n-th driving stage (where n is an integer of 3 or more) of the plurality of driving stages comprises:
   a first control transistor comprising a first terminal connected to a first input terminal and a second terminal connected to a first node, and configured to increase a voltage of the first node to a first voltage when being turned on according to a signal applied to the first input terminal;
   a control capacitor having a first end connected to the first node;
   a second control transistor comprising a first terminal connected to a second input terminal and a second terminal connected to a second end of the control capacitor, and configured to increase the first voltage of the first node to a second voltage that is higher than the first voltage when being turned on according to a signal applied to the second input terminal;
   a third control transistor comprising a control terminal connected to the first node, a first terminal connected to the second input terminal, and a second terminal connected to a second node, and configured to increase a voltage of the second node to a third voltage when being turned on according to a voltage applied to the first node; and
   an output transistor comprising a control terminal connected to the second node, a first terminal connected to a first clock terminal, and a second terminal connected to an output terminal, and the output transistor being configured to output the gate signal of the n-th driving stage to the output terminal when being turned on according to the voltage applied to the second node.

2. The gate driving circuit of claim 1, wherein the first input terminal is configured to receive a control signal of an (n−2)-th driving stage, and the second input terminal is configured to receive a control signal of an (n−1)-th driving stage.

3. The gate driving circuit of claim 1, wherein a control terminal of the first control transistor is connected to the first input terminal, and a control terminal of the second control transistor is connected to the second input terminal.

4. The gate driving circuit of claim 1, wherein the n-th driving stage further comprises an output capacitor comprising a first end connected to the output terminal, and a second end connected to the second node,
   the output capacitor being configured to increase the voltage of the second node from the third voltage to a fourth voltage that is higher than the third voltage while the gate signal of the n-th driving stage is outputted.

5. The gate driving circuit of claim 1, wherein the second voltage is higher than the sum of a voltage of the signal applied to the second input terminal and a threshold voltage of the third control transistor.

6. The gate driving circuit of claim 1, wherein the n-th driving stage further comprises:
   a first voltage input terminal configured to receive a first low-level voltage;
   a second voltage input terminal configured to receive a second low-level voltage that is lower than the first low-level voltage; and
   a first pull-down transistor comprising a control terminal connected to the first clock terminal, a first terminal connected to the first node, and a second terminal connected to the second voltage input terminal,
   the first pull-down transistor being configured to pull down the voltage of the first node to the second low-level voltage according to a signal applied to the first clock terminal, and to float the second node during outputting of the gate signal.

7. The gate driving circuit of claim 6, wherein the n-th driving stage further comprises a second pull-down transistor comprising a control terminal connected to a second clock terminal, a first terminal connected to the first voltage input terminal, and a second terminal connected to the second terminal of the output transistor,
   the second pull-down transistor being configured to pull down a voltage of the output terminal to the first low-level voltage according to a signal applied to the second clock terminal.

8. The gate driving circuit of claim 7, wherein the n-th driving stage further comprises:
   a first holding transistor comprising a control terminal connected to a third clock terminal, a first terminal connected to the first voltage input terminal, and a second terminal connected to the output terminal, and
   a second holding transistor comprising a control terminal connected to the third clock terminal, a first terminal connected to the second voltage input terminal, and a second terminal connected to the second node,
   the first holding transistor being configured to hold a voltage of the output terminal as the first low-level voltage according to a signal applied to the third clock terminal, and the second holding transistor being configured to hold a voltage of the second node as the second low-level voltage according to the signal applied to the third clock terminal.

9. The gate driving circuit of claim 8, wherein the first clock terminal is configured to receive a high-level voltage during an n-th section, the second clock terminal is configured to receive a high-level voltage during an (n+1)-th section, and the third clock terminal is configured to receive a high-level voltage during an (n+2)-th section.

10. The gate driving circuit of claim 1, wherein the n-th driving stage further comprises a control transistor comprising a control terminal connected to the second node, a first terminal connected to the first clock terminal, and a second terminal connected to a carrying terminal, and configured to output a control signal of the n-th driving stage according to the signal of the first clock terminal.

11. A display device, comprising:
a display panel comprising a plurality of gate lines, a plurality of data lines crossing the gate lines, and a plurality of pixels respectively connected to corresponding ones of the gate lines and corresponding ones of the data lines;
a data driving circuit configured to provide data signals to the plurality of data lines; and
a gate driving circuit comprising a plurality of driving stages connected to each other in a cascade structure, and configured to provide a gate signal to the gate lines,
wherein an n-th driving stage (where n is an integer of 3 or more) of the plurality of driving stages comprises:
a first control transistor comprising a first terminal connected to a first input terminal and a second terminal connected to a first node and configured to increase a voltage of the first node to a first voltage when being turned on according to a signal applied to the first input terminal;
a control capacitor having a first end connected to the first node;
a second control transistor comprising a first terminal connected to a second input terminal and a second terminal connected to a second end of the control capacitor and configured to increase the first voltage of the first node to a second voltage that is higher than the first voltage when being turned on according to a signal applied to the second input terminal;
a third control transistor comprising a control terminal connected to the first node, a first terminal connected to the second input terminal, and a second terminal connected to a second node and configured to increase a voltage of the second node to a third voltage when being turned on according to a voltage applied to the first node; and
an output transistor comprising a control terminal connected to the second node, a first terminal connected to a first clock terminal, and a second terminal connected to an output terminal, the output transistor being configured to output a gate signal of the n-th driving stage to the output terminal when being turned on according to the voltage applied to the second node.

12. The display device of claim 11, wherein the first input terminal is configured to receive a control signal of an (n−2)-th driving, and the second input terminal is configured to receive a control signal of an (n−1)-th driving stage.

13. The display device of claim 11, wherein the second voltage is higher than the sum of a voltage of the signal applied to the second input terminal and a threshold voltage of the third control transistor.

14. The display device of claim 11, wherein the n-th driving stage further comprises a pull-down transistor comprising a control terminal connected to the first clock terminal, a first terminal connected to the first node, and a second terminal connected to a voltage input terminal,
the pull-down transistor being configured to pull down the voltage of the first node according to a signal applied to the first clock terminal, to float the second node during outputting of the gate signal.

15. The display device of claim 11, wherein a control terminal of the first control transistor is connected to the first input terminal, and a control terminal of the second control transistor is connected to the second input terminal.

16. The display device of claim 11, wherein the n-th driving stage further comprises an output capacitor comprising a first end connected to the output terminal, and a second end connected to the second node,
the output capacitor being configured to increase the voltage of the second node from the third voltage to a fourth voltage that is higher than the third voltage while the gate signal of the n-th driving stage is outputted.

* * * * *